United States Patent

Moyle et al.

[15] 3,706,840

[45] Dec. 19, 1972

[54] SEMICONDUCTOR DEVICE PACKAGING

[72] Inventors: Kenneth J. Moyle, Palo Alto; Richard S. Mann, Mountain View, both of Calif.

[73] Assignee: Intersil Incorporated

[22] Filed: May 10, 1971

[21] Appl. No.: 141,793

[52] U.S. Cl. ............174/52 PE, 29/588, 174/DIG. 3, 317/101 CP, 317/234 E, 264/272

[51] Int. Cl. ..............................................H05k 5/00

[58] Field of Search .........174/52 PE, 52 R; 264/272; 317/234 E, 234 G, 101 A, 101 CP; 29/626, 588; 317/234 F

[56] References Cited

UNITED STATES PATENTS

| | | | |
|---|---|---|---|
| 3,423,638 | 1/1969 | Dix et al. | 174/52 S X |
| 3,509,430 | 4/1970 | Mroz | 317/234 F UX |
| 3,514,849 | 6/1970 | Landron, Jr. | 317/234 F X |

*Primary Examiner*—Darrell L. Clay
*Attorney*—Gregg, Hendricson & Caplan

[57] ABSTRACT

An improved semiconductor device package and process of manufacture incorporating an inner rigid glass structure including mounting pad and lead fingers and a surrounding plastic package through which leads extend.

10 Claims, 8 Drawing Figures

INVENTORS
KENNETH J. MOYLE
RICHARD S. MANN
BY
Gregg, Henderson & Caplan
ATTORNEYS INVENTORS
KENNETH J. MOYLE
RICHARD S. MANN
BY
Gregg, Henderson & Caplan
ATTORNEYS

SEMICONDUCTOR DEVICE PACKAGING

BACKGROUND OF INVENTION

It is recognized that semiconductor devices require some type of enclosure or packaging for commercial adaptation of such devices. Without delving deeply into the subject, it is only briefly noted that semiconductor devices, including integrated circuit devices, are normally formed of a very small size so as to be almost incapable of direct handling and connection by users. Additionally, the very nature of semiconducting devices requires sealing or encapsulation of same to prevent degrading of the devices with time.

Protective encapsulation of semiconductor devices and circuits not only provides for safeguarding same from the effects of shock and environmental conditions but also in many cases provides for dissipation of heat generated by operation of the devices. Particular encapsulation or packaging problems arise in the field of integrated circuits wherein a relatively large number of electrical conductors or leads must be provided for connection of such devices or circuits to other portions of electronic circuitry. It is, in fact, quite common to provide 40 lead units for integrated circuit devices.

Although there have been proposed a wide variety of different types of packaging for integrated circuit devices and the like, one of the most common and, in fact, most satisfactory is found in what is generally termed the glass package. This type of packaging provides for surrounding the device connected by fine wires to preformed conductors of a lead frame with a glass sandwich fused in place to thereby form a hermetic seal about the device and connections thereof. With the use of a Kovar lead frame and an aluminum oxide glass, there is provided true hermetic sealing of the device and connections and additionally the package has a substantial strength. Also in this general field of packaging there have been developed a wide variety of metal enclosures generally including glass to metal seals. One of the major disadvantages of this type of relatively superior packaging is the high cost thereof. It is particularly true in devices requiring a large number of leads that the cost of hermetically sealing the device is almost prohibitive. Commonly the packaging cost materially exceeds the cost of the device and connection thereof. The high cost of this type of semiconductor packaging lies in part in the cost of materials employed and, furthermore, in the limited yield obtainable. Numerous limitations are encountered in glass packaging of the type generally noted above and these not only militate against high yield but also pose problems in other areas of manufacture.

Another high quality type of package is the ceramic package which in many ways is similar to the glass package. Ceramic packages normally include printed conducting areas thereon to which leads are brazed. This type of package is also quite expensive.

In order to reduce the cost of semiconductor device packaging there have been developed non-hermetic plastic packages. Plastic packages have found fairly wide acceptance in commerce despite the manifold limitations thereof. Among the difficulties or limitations to be found in this type of packaging is the moisture path that exists along metal-plastic interfaces because of the failure of plastic and metal to form a hermetic seal. Flexing of the lead frame during molding operations reduces yield and, in fact, seriously limits application of this type of packaging to devices requiring a large number of leads. There is also encountered problems with the failure of wire bonds because of transfer pressure employed in plastic packaging. Possibly even more basic difficulties of this type of packaging lie in failures at elevated temperature levels, the poor heat dissipation properties of plastic and the relatively low strength of plastic.

The present invention provides a new and highly advantageous device packaging incorporating the advantages of glass or ceramic packaging without the attendant difficulties and cost thereof and, at the same time, incorporating the advantages of plastic packaging without inclusion of the limitations previously attendant thereto.

SUMMARY OF INVENTION

The present invention provides an improved semiconductor device package and method of manufacture. The device mounting pad and lead fingers of a lead frame are included in a rigid central glass structure having a base portion beneath the foregoing elements and an upstanding wall about these elements above same. Within the encircling wall noted above there is then mounted a device with fine wires extending from device contacts to lead fingers. The device and wires are then covered by an appropriate insulating material applied as a liquid and hardening in place. This material is commonly termed a conformal coating. This structure, including the lead frame, is then subjected to plastic packaging extending well beyond the interior rigid glass structure but short of the outer ends of the leads of the frame. The exterior rim of the frame is then removed to provide device connectors by the leads extending from the plastic envelope.

DESCRIPTION OF FIGURES

The present invention is illustrated as to particular preferred embodiments thereof and steps in the process of manufacture in the accompanying drawing wherein:

FIG. 4 schematically illustrates at A through E major steps in the packaging process of the present invention;

DESCRIPTION OF PREFERRED EMBODIMENT

Semiconductor device packages, and particularly those adapted for integrated circuit devices, may be made in a variety of forms such as, for example, D.I.P.

(dual inline package), edge mount packages and flat packs. Additionally, a variety of different materials are employed for semiconductor device packages such as glass, ceramic and plastic in various combinations with metal. The present invention is illustrated herein with respect to a D.I.P. package, although it is in no way limited to such package configuration. Furthermore the following description of the present invention identifies one of the materials employed as being glass; however, it is noted that ceramic materials may be substituted therefor.

Figures 1, 2, 3, 4A, 4B, 4C, 4D, 4E:
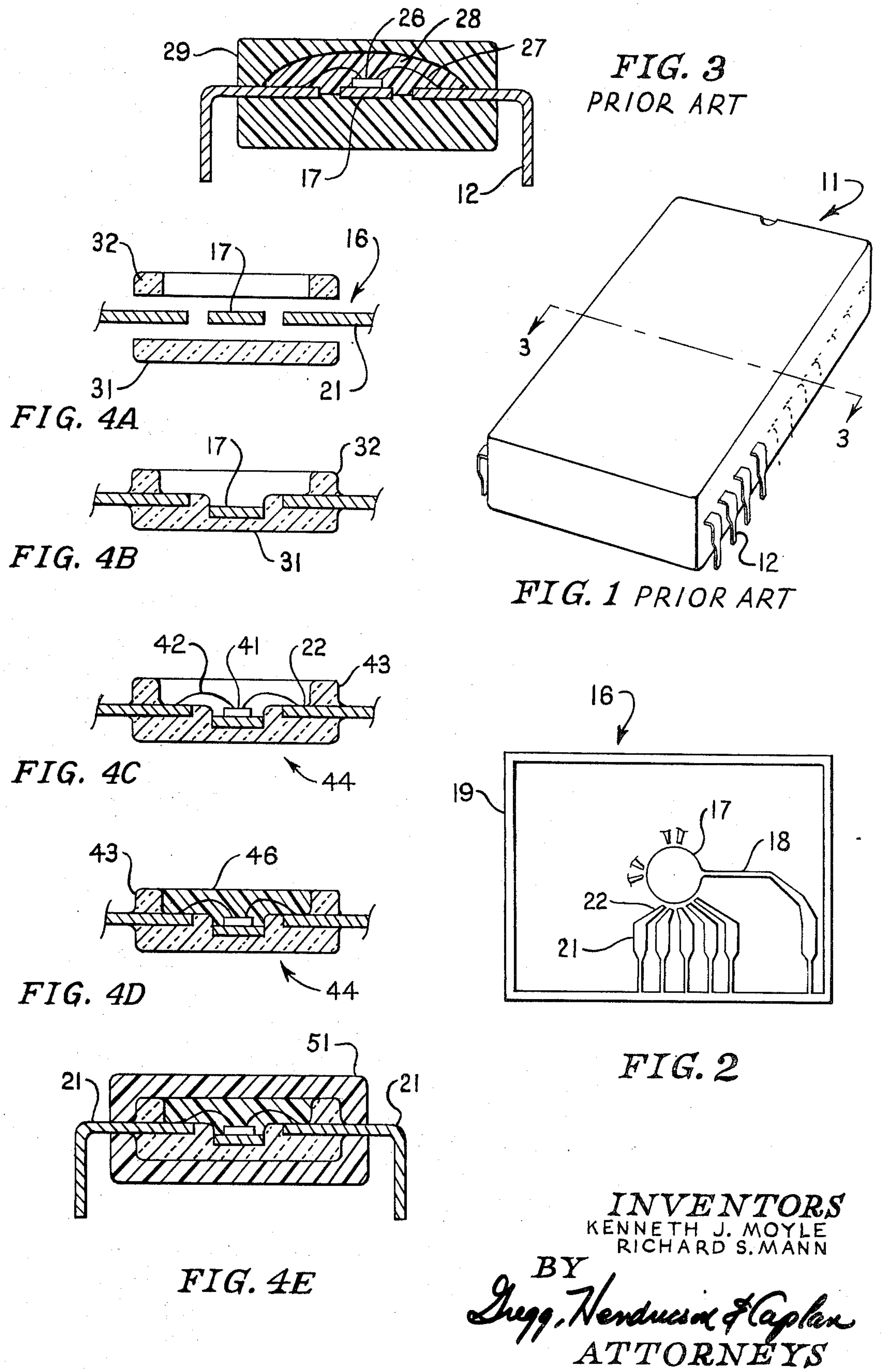
FIG. 3 PRIOR ART, FIG. 1 PRIOR ART, FIG. 4A, FIG. 4B, FIG. 4C, FIG. 4D, FIG. 2, FIG. 4E
FIG. 1 is a perspective view of a typical prior art plastic semiconductor package.
FIG. 2 is a plan view of a conventional lead frame as may be employed in the present invention.
FIG. 3 is a transverse sectional view in the plane 3—3 of FIG. 1 showing internal elements of a conventional plastic package.

There is illustrated in FIG. 1 a conventional D.I.P. plastic package 11. Within this package there is mounted an integrated circuit device, for example, and a plurality of electrical leads extend from the periphery of the package and are bent over to form connectors 12, as indicated. A package of this type is thus adapted for plugging into a circuit board or the like by inserting the male connectors 12 in female connectors of the board.

It is conventional in forming various types of semiconductor packages, including the one shown in FIG. 1, to employ a lead frame such as the frame 16 illustrated in FIG. 2. This frame is formed of a thin metal and includes a central mounting pad 17 with at least one support member 18 extending to a rim 19 about the frame. Leads 21 extend inwardly from the rim 19 into close proximity with the central mounting pad 17 and the inner portions of these leads are commonly termed lead fingers, as indicated at 22. Lead frames may have a wide variety of different physical configurations depending upon the type of package to be formed but it will be appreciated that in general the frame has a relatively fragile nature as the overall dimension thereof is quite small and the dimensions of individual elements are extremely small. Furthermore the inner portions of the leads 21 are unsupported and consequently it is normally necessary to take considerable care to ensure that the frame itself remains planar during package manufacturing.

In a conventional plastic package, as well as in various other types of semiconductor packages, a semiconductor device 26 is mounted on the central pad 17 and fine wires 27 are connected between device contacts and the inner ends 22 of the electrical leads 21, as indicated in FIG. 3. Technology for mounting of semiconducting devices on mounting pads and connection of semiconductor device contacts to electrical leads are well known in the art and consequently are not further described herein. Reference in this respect is made to general publications in the field identifying various manners and means of mounting and connecting semiconductor devices including integrated circuit devices. It is at this point noted that the present invention is particularly adapted to the packaging of integrated circuits wherein a substantial number of external leads are required. Twenty-eight lead devices of 40 lead devices, as well as devices with larger number of leads, are well known in the art and it is with respect to this type of device that the present invention finds its greatest advantage.

Further with regard to plastic packages and referring to FIG. 3, there will be seen to be provided a conformal coating 28 over the device 26 and wires 27 therefrom. This coating is normally applied as a large drop of a high purity liquid material which is hardened or set by heat. This material 28 may, for example, comprise a type of epoxy resin or some type of high purity silicon plastic, as is known in the art.

A plastic material 29 is then applied to the unit to form the exterior configuration illustrated in FIG. 1. This plastic material may be applied by transfer molding in a manner known in the art. The molding operation is accomplished by the application of heat and pressure in a mold to produce the desired exterior configurations illustrated. The exterior rim 19 of the frame is then removed and the outer ends of the leads 21 may, for example, be bent as illustrated in FIGS. 1 and 2 to form a package that may be plugged into a printed circuit board, for example. Although this type of packaging is acknowledged to be advantageous in minimization of cost, it is equally well recognized that there are certain limitations inherent in this type of package and also certain difficulties in the manufacture thereof. Of prime importance is the failure of existing plastics to form a hermetic seal with the leads of the package. Consequently there results a moisture path along the metal-plastic interfaces from the exterior of the package to the semiconductor device therein. This then precludes use of this type of package for many applications. With regard to problems of manufacture relating to the yield available, it is noted that flexing of the lead frame during molding operations reduces the yield and actually militates against the applicability of this type of packaging to devices requiring a large number of leads. Flexing of the lead frame also makes handling of the frame and device during assembly quite difficult and adds to the yield loss. During the application of the plastic plates to the frame of the device mounted thereon, it is conventional to employ a transfer pressure which in many instances tends to displace or disconnect the fine wires 27 extending from the device to the leads. It has also been established that the plastic-metal interface produces failures at elevated temperature levels and it is known that plastic dissipates heat poorly and has relatively low strength.

Despite the numerous limitations of plastic packaging the very material reduction in cost of plastic packages over glass packages has caused relatively widespread acceptance of plastic packaging, at least for various applications.

It is known to encapsulate or package semiconductor devices such as integrated circuits in glass packages. This field is well known in the art and is thus not extensively commented upon herein other than to note that the truly hermetic seal obtainable by the fusion of glass to metal is highly advantageous and is also quite expensive. A variety of factors contribute to the relatively high cost of glass packaging. In part the cost of materials is high but additionally the attainment of requisite dimensional tolerances in fused glass containers limits the yield so as to further increase the output cost. Purely as an example, a 40 lead glass package may cost seven times as much as a 40 lead plastic package.

The present invention provides an improved semiconductor device package and method of manufacture incorporating the advantages of both plastic and glass packages. Problems in manufacture and/or fabrication of both types of packages are substantially entirely overcome hereby and yet a truly hermetic seal is obtained by the present invention, with the cost of packaging in accordance herewith being much closer to the cost of plastic packaging than glass packaging.

Referring now to FIG. 4 there is schematically illustrated successive steps in the improved packaging of the present invention. At FIG. 4A the lead frame 16 is shown with a glass plate 31 disposed below the central portion of the frame and a glass ring 32 disposed above this same portion. The ring 32 may have any desired configuration such as circular, oval, oblong, rectangular, or the like. In practice it is convenient to form the ring as an annulus and the plate 31 with the circular configuration of the same diameter as the ring. The material of the plate and ring is a glass and, in accordance with prior art teachings, may incorporate in addition to $SiO_2$ some desired percentage of $AlO_2$. It is to be further noted that the dimensions of the ring are such as to provide an internal opening sufficient to encompass not only the mounting pad 17 but also an inner portion of the leads, denominated above as lead fingers 22. Furthermore the exterior dimension of the ring is substantially less than the ultimate package width or length.

The lead frame 16 is formed with only one support or connecting member 18 extending from the mounting pad 17 to the frame 19, for reasons noted below. This member 18 may serve only to initially support the pad 17 in position or alternatively may also comprise an electrical lead from the pad. It is further noted that the provision of a dam bar on the lead frame and subsequent removal of same as by a quill die may be included herein, as may lead rigidity holes.

The ring, lead frame and plate are fused together by the application of heat and pressure. The lead frame is formed of a nickel-iron-cobalt alloy such as Kovar metal having the same coefficient of expansion as glass and thus, again in accordance with known technology, a complete hermetic seal is formed at the interface of the lead frame and glass. Fusion of the ring and plate together with the lead frame therebetween is accomplished at an elevated temperature sufficient to soften the glass and thus it is possible in this operation to depress the mounting pad 17 of the lead frame into the plate so as to actually dispose the pad below the level of the lead fingers. This configuration is illustrated at FIG. 4B and it is noted that, although depression of the mounting pad is not necessary, it does provide certain advantages in connection with wire bonding of device contacts with finger leads, as discussed below. It will also be noted in FIG. 4B that fusion of the ring and plate commonly produces a meniscus at the joinder of glass and metal. This has proven to be a substantial problem in prior art glass packaging because of the possibility of cracking the glass during subsequent bending operations upon the leads extending from the package. In the present invention this slight extension of the glass outwardly, as indicated, poses no problem, as will become apparent below.

Figure 5:
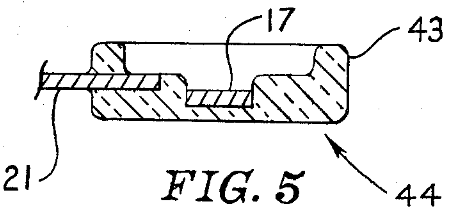
FIG. 5 is a sectional view of the central rigid structure of the present package following the step of FIG. 4B.

It is emphasized that the glass plate and ring fuse together to form a single rigid element encompassing the central portion of the lead frame. FIG. 5 schematically illustrates the structure by a sectional depiction of this central portion at least in part in a plane intermediate electrical leads 21. As will be seen at the right of FIG. 5 the ring and plate are fused together into a single unitary element. The rigidity of this resultant central element is highly desirable in subsequent device mounting and connection. As noted above, the lead frame 16 alone is relatively fragile and it is necessary that the electrical leads 21 extending inwardly from the frame rim terminate short of the central pad in order that no electrical connection will be formed therebetween. This then results in an undesirable degree of flexibility of the inner ends of the leads. However, by proceeding in accordance with the present invention to form a central rigid element or portion by glass fusion, the inner ends of the leads are fixed in position with respect to each other and to the mounting pad so that problems of lead frame flexing are obviated.

With the central rigid portion of the present invention formed as described above, a semiconductor device may then be mounted and connected therein. This is illustrated in FIG. 4C wherein there is shown a device 41 secured to the pad 17 and having fine electrically conducting wires 42 connected between desired device contacts and lead fingers 22. The device mounting and wire bonding may be accomplished in conventional manner; however, it is noted that the rigidity of the central portion of the lead frame materially facilitates these operations. With regard to the depression in the mounting pad with regard to the plane of the lead fingers, it is noted that the very fine nature of the wires 42 oftentimes results in some sagging of the wires between ends. In this respect it is extremely important to prevent these wires 42 from sagging enough to electrically contact the mounting pad. As shown in FIG. 4C, depression of the mounting pad below the lead fingers provides for these fine wires to actually extend upwardly from the device to the lead fingers so that, even if some sagging of the wires does occur, it is extremely unlikely that they could sag far enough to touch the mounting pad.

Following mounting of the device and connection of same to the lead fingers, the device, wires and lead frame are encased in plastic in much the same manner as described above in connection with FIGS. 1 and 3. As illustrated in FIG. 4D, a conformal coating such as a liquid resin 46, for example, is applied over the device, wires and lead fingers within the glass wall 43 of the fused element 44. This material 46 may comprise any one of a variety of electrically insulating materials that may be applied in liquid form and then set into solid form, such as an epoxy resin or silicon plastic. Setting may be accomplished by the application of heat or chemical action. The central portion of the device package as illustrated in FIG. 4D will thus be seen to completely envelope the device, the electrical wires extending therefrom, and the connections of these wires to the lead fingers of the lead frame.

Following this complete encapsulation of the device and immediate connections thereto, there is then applied a plastic cover as a further step in the present invention. In this respect reference is made to FIG. 4E wherein there is illustrated a plastic cover 51 enveloping the central portion including element 44. This plastic 51 may be conventionally applied as described above by the application of heat and pressure, with the exterior of the lead frame extending peripherally beyond the edges of the plates. With the devices fully encapsulated in the rigid central section of the package, application of transfer pressure to bond the plastic to the lead frame does not affect the device itself nor the fine wires extending from the device contacts to the lead fingers. Furthermore the central rigid portion of the package including the fused glass element is entirely surrounded by plastic which does not exhibit undue dimensional instability during fabrication. Additional conventional steps in applying a plastic cover are not described herein.

The package is completed by trimming or cutting the rim 19 from the lead frame and, for the type of package illustrated, by then bending the leads extending from the package proper to extend these as connectors from opposite edges of the package and directed toward the same flat package side. This bending operation poses no problem in the process of the present invention inasmuch as the glass portion of the package is spaced from the bend lines and consequently cracking of the glass does not occur. This then improves the yield available with this process.

It is to be appreciated that the particular package produced by the present invention described above may physically resemble or, in fact, be substantially identical in exterior appearance to the D.I.P. package 11 illustrated in FIG. 1. Alternatively, of course, the present invention is equally applicable to edge mount packages and so-called flat-packs as well as other package configurations. It is also to be noted that in the illustrations of the present invention, certain dimensions and in fact relative dimensions are greatly exaggerated. This is necessary in order to provide an illustration of the extremely minute devices, connections and elements actually employed and also to properly illustrate the relative positions of portions of the package. In addition general semiconductor technology and semiconductor packaging technology is assumed to be available to the reader and is consequently not reiterated herein. For example, the fusing of glass to Kovar metal is well known as is the bonding of various types of plastics in semiconductor device fabrication.

Figure 8A:
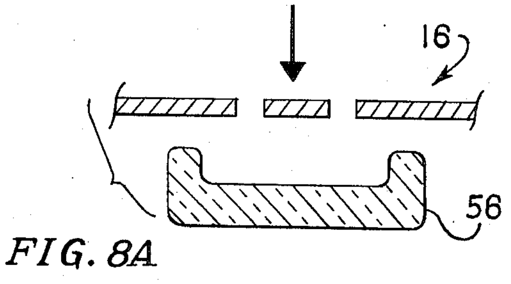
FIG. 8 illustrates at A and B alternative steps in the process of this invention.
Figures 6, 8B:
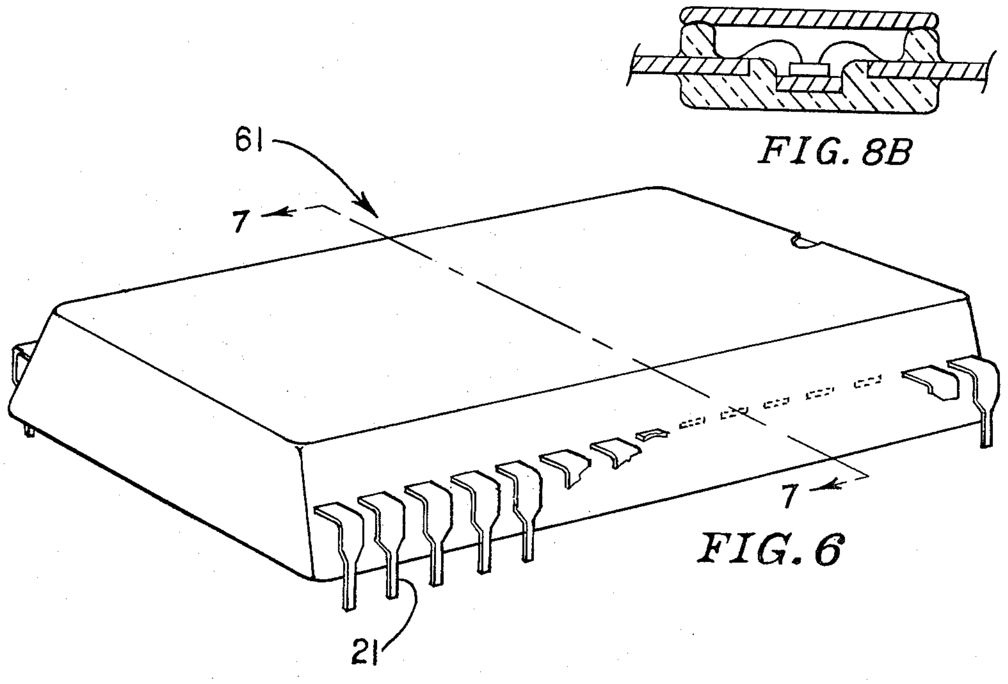
FIG. 6 is a perspective view of a D.I.P. (dual inline package) in accordance with the present invention.
Figure 7:
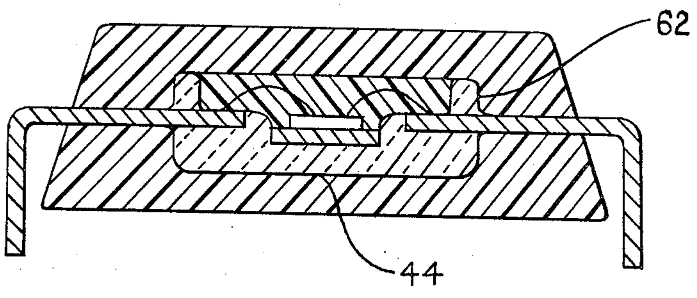
FIG. 7 is a sectional view taken in the plane 7—7 of FIG. 6.

There is illustrated in FIGS. 6 and 7 a complete dual inline package for a semiconductor integrated circuit device in accordance with the present invention. As noted above, the exterior configuration of the package 61 may be substantially identical to that of a conventional D.I.P. plastic package 11 as illustrated in FIG. 1. There is, however, provided internally of the package a rigid central portion 62 including the lead frame mounting pad and lead fingers bonded to the fused glass element 44. Hermetic sealing of the glass to metal of the lead frame precludes the existence of a moisture path along the leads through the package.

Certain of the steps in the process described above may be modified or altered. Thus, for example, in diffusing of glass to the lead frame, there may be employed a single pellet of glass rather than the plate and ring described and illustrated. Such a pellet would be provided as a cup-shaped element having substantially the same cross sectional configuration as the plate and ring fused together. Referring to FIG. 8A, there will be seen to be illustrated such a cup-shaped pellet 56 with the lead frame 16 disposed above same. The pellet 56 is controllably heated to softening temperature and the lead frame is then placed on the top of the pellet and pressed downwardly as by application of a weight, as indicated by the arrow in FIG. 8A. The lead frame then sinks through the softened glass to thus produce the configuration schematically illustrated at FIG. 4B. The glass pellet is heated substantially to the same temperature as would be the glass plate and ring in the previously described step of the present invention, i.e., to a point wherein the glass is softened but is not liquid to the point of flow.

As an example of a further modification of the above described process, it is noted that, rather than employing a conformal coating 46 over the device and leads as indicated at FIG. 4D, there may be applied a glass or metal cap to close the top of the element 44. This is schematically illustrated at FIG. 8B wherein there is illustrated a plate 57 formed, for example, of Kovar metal disposed atop the wall 43 of the fused glass element 44 and fused thereto by the application of heat to form a hermetic seal. This plate 57 could alternatively be formed of glass and fused to the wall 43 about the top of same. The process is then continued to form the plastic cover about the central rigid element.

Various other modifications and variations of the process hereof are also possible; however, it is noted that the central rigid portion of the package hereof formed of glass or ceramic material is much smaller than conventional glass packages and may, for example, employ but about 20 percent of the amount of glass normally utilized in a glass package. This in itself provides a material saving in the total cost of the end product. It is again noted that the rigid central portion of the present invention prevents flexing of the interior part of the device during manufacture so that breaking of the wire bonds is substantially precluded. This then affords a material improvement in the available yield with the present process.

It will be seen from the foregoing that there is provided by the present invention an improved process for semiconductor device packaging and an improved device package. Substantially all of the advantages of prior art glass packages and prior art plastic packages are achieved by the present invention while at the same time precluding difficulties and limitations both in the manufacture and end product of each.

What is claimed is:

1. A process for packaging a semiconductor device comprising fusing glass to the central portion of a lead frame having leads and a mounting pad to form a glass base beneath such portion and an upstanding glass wall upon the frame surrounding the mounting pad and adjacent lead fingers of the frame to form a central rigid package portion, securing a semiconductor device upon the mounting pad and connecting device contacts to lead fingers within the wall of the central package portion, applying a conformal coating over the device and connections within the glass wall, and molding a plastic encapsulant about the central portion of the package enclosing the same with the extremities of the lead frame extending therefrom.

2. The process of claim 1 including the step of depressing the lead frame mounting pad in the glass during fusing of the glass to dispose the pad below the lead fingers.

3. The process of claim 1 wherein the step of applying said conformal coating comprises substantially filling the well within said upstanding wall with a liquid thermosetting encapsulant material and heating the material to solidify the material.

4. The process of claim 1 wherein the step of fusing the glass to the lead frame comprises disposing a glass plate beneath the center of the lead frame, disposing a glass ring atop the lead frame and applying heat and pressure to the glass to hermetically seal the glass to the frame and fuse the ring and plate together.

5. The process of claim 1 additionally including the step of cutting away the outer extremity of the lead frame to leave individual leads extending from the encapsulated semiconductor device as connectors thereof.

6. A method of packaging a semiconductor device wherein the device is mounted upon a central pad of a lead frame, comprising a. disposing a glass plate beneath the lead frame pad and extending outwardly beneath lead fingers of the frame, b. disposing an upstanding glass wall upon the lead frame about the frame pad and a short inner extension of lead fingers, c. fusing the frame and glass together to form a rigid central structure of the lead frame, d. mounting a semiconductor device on the top of the frame pad and electrically connecting device terminals to lead fingers within the glass wall, e. sealing the device and electrical connections within the glass wall with a conformal coating, and f. molding a plastic encapsulant about the central structure including device and connections enclosing the same but excluding the outer ends of leads of the frame.

7. An improved packaged semiconductor device comprising a central rigid structure of electrically insulating glass with a flat base and an upstanding wall thereabout, a device mounting pad disposed upon the upper surface of said base within said wall and having a semiconductor device mounted thereon, a plurality of metal leads extending through said wall and fused thereto with short lead fingers extending into close proximity to said pad on the glass base and substantial extensions exteriorly of said glass wall, said leads being electrically connected to said device, an encapsulant disposed within said glass wall in enveloping and sealing relation to the device on said pad and the connections between the device and lead fingers, and a plastic encapsulation enclosing said rigid central structure and extending laterally beyond same short of the ends of said metal leads and bonded to the structure and leads with lead ends extending therefrom as connectors for the packaged device.

8. The package of claim 7 wherein said plurality of metal leads are formed of a nickel-iron-cobalt alloy and said glass is fused thereto forming a hermetic seal to the leads.

9. The package of claim 7 wherein said device mounting pad is disposed slightly below said lead fingers interiorly of said glass wall.

10. A process for packaging a semiconductor device having contacts comprising heating a cup-shaped glass element only to softening temperature, forcing a metal lead frame having leads and a mounting pad downwardly into the softened glass to sink the frame at least to the upper surface of the cup bottom with the frame mounting pad and lead fingers disposed within the cup and the leads extending through the cup walls exteriorly thereof to form a central rigid package portion, securing a semiconductor device upon said mounting pad within the cup-shaped glass element, bonding wires to and between the lead fingers and the device contacts for interconnection thereof within said element, sealing said device and wires within said element, and molding a plastic encapsulant in enclosing relation about the rigid central portion of the package with the extremities of the lead frame extending therefrom as connectors for the packaged device.

* * * * *